US006433528B1

(12) United States Patent
Bonelli et al.

(10) Patent No.: US 6,433,528 B1
(45) Date of Patent: Aug. 13, 2002

(54) HIGH IMPEDANCE MIRROR SCHEME WITH ENHANCED COMPLIANCE VOLTAGE

(75) Inventors: Andrea Bonelli, Villeneuve Loubet; Francois V. E. Bauduin, La Gaude, both of (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/745,030

(22) Filed: Dec. 20, 2000

(51) Int. Cl.7 .............................. G05F 3/20; H03K 5/32
(52) U.S. Cl. .......................... 323/315; 323/314; 327/66
(58) Field of Search ................................ 323/315, 313, 323/312, 314, 316; 327/563, 66, 70; 330/107

(56) References Cited

U.S. PATENT DOCUMENTS 3,987,368 A * 10/1976 Ahmed ........................ 330/69
4,219,781 A * 8/1980 Naokawa .................... 330/254
5,087,830 A * 2/1992 Cave et al. .............. 307/296.5
5,173,656 A * 12/1992 Seevinck et al. ........... 323/314
5,386,336 A * 1/1995 Kim et al. .................... 361/93
5,712,810 A * 1/1998 Kimura ....................... 364/841
6,002,299 A * 12/1999 Thomson ....................... 330/9
6,064,240 A * 5/2000 Wachter ..................... 327/666

* cited by examiner

*Primary Examiner*—Rajnikant B. Patel
(74) *Attorney, Agent, or Firm*—J. Dennis Moore; W. James Brady, III; Frederick J. Telecky, Jr.

(57) ABSTRACT

A high-impedance current source 100 having an enhanced compliance voltage. The current source 100 preferably has a means for generating a biasing current 105 and a first current mirror stage having a first transistor M6 coupled to a second transistor M1. A second current mirror stage having a third transistor M2 coupled to a fourth transistor M5 acts as a feedback circuit. A stabilization circuit having a fifth transistor M3 coupled to a sixth transistor M4 are also included. The stabilization circuit is coupled between the first and second current mirror stages and an output circuit having a seventh transistor M7 is connected to the stabilization circuit between the first and second current mirror stages. The current mirror circuit has a low compliance voltage, enhanced operating characteristics and enhanced dynamics which eliminate the need for OTAs.

22 Claims, 4 Drawing Sheets

*FIG. 1*
*(PRIOR ART)*
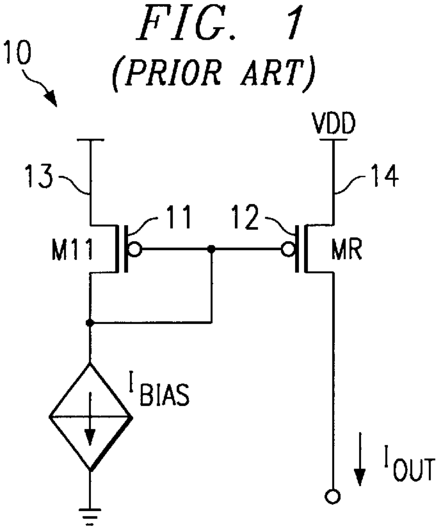
*FIG. 2*
*(PRIOR ART)*
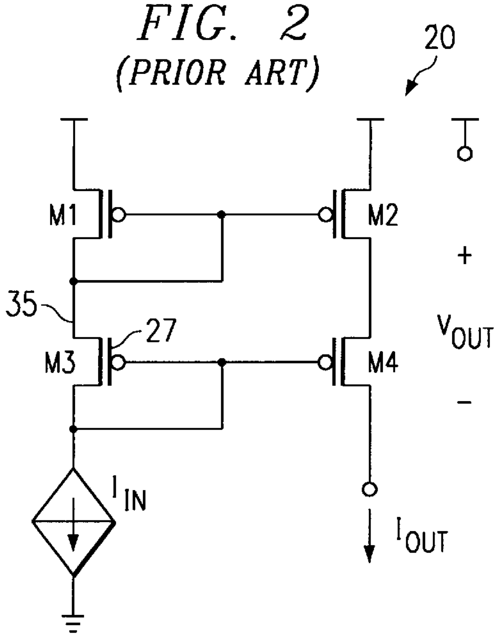
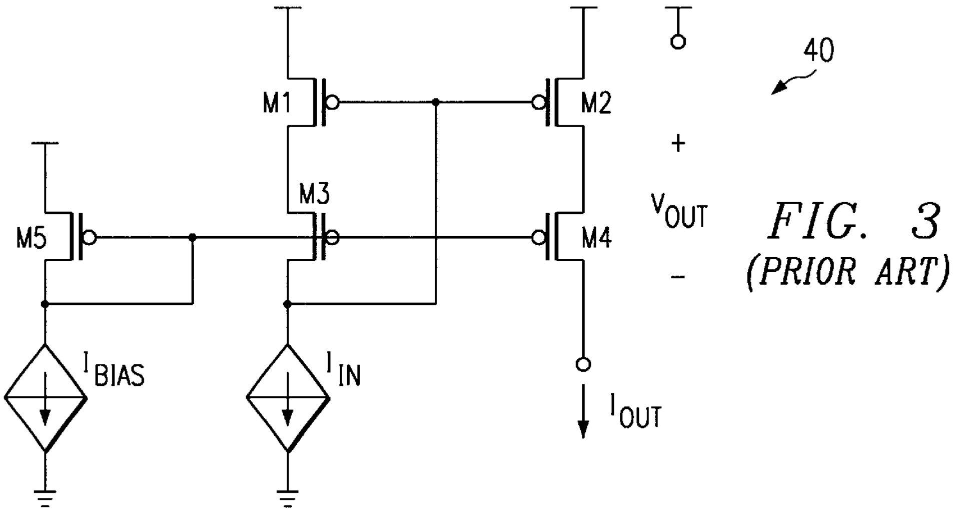
*FIG. 3*
*(PRIOR ART)*
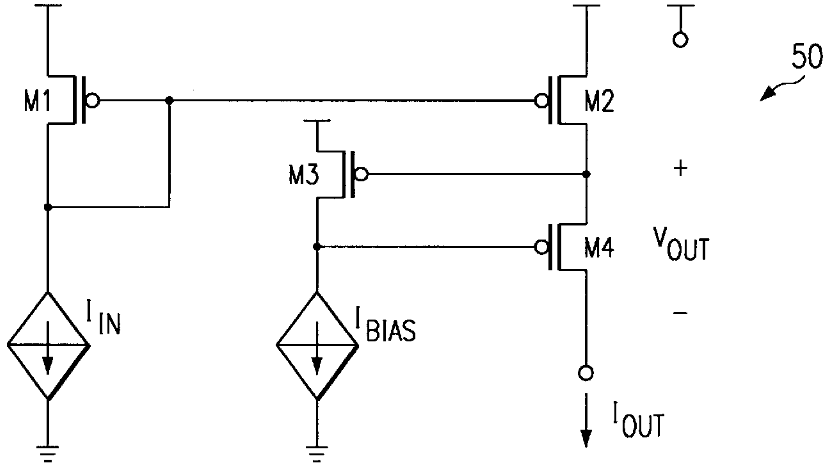
*FIG. 4*
*(PRIOR ART)*

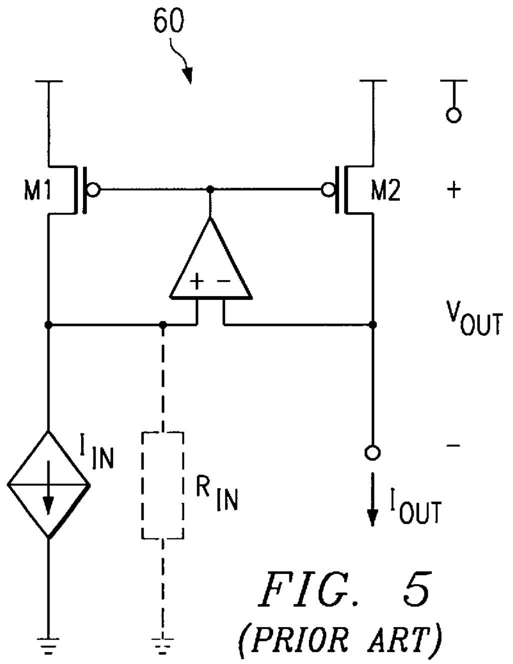
*FIG. 5*
*(PRIOR ART)*
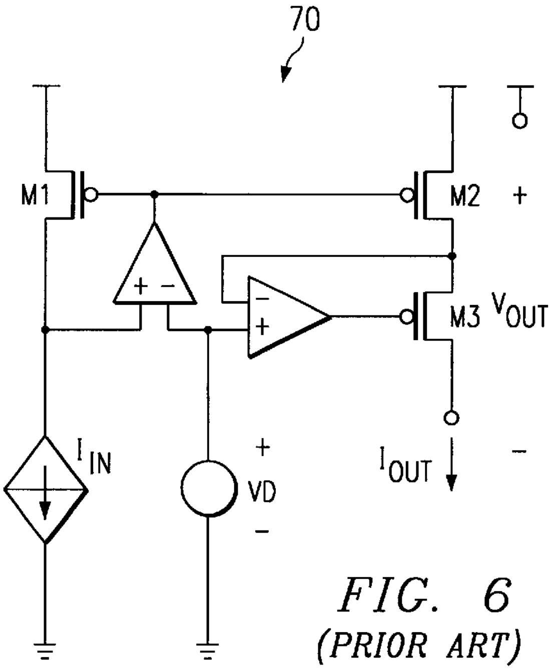
*FIG. 6*
*(PRIOR ART)*
*FIG. 7*
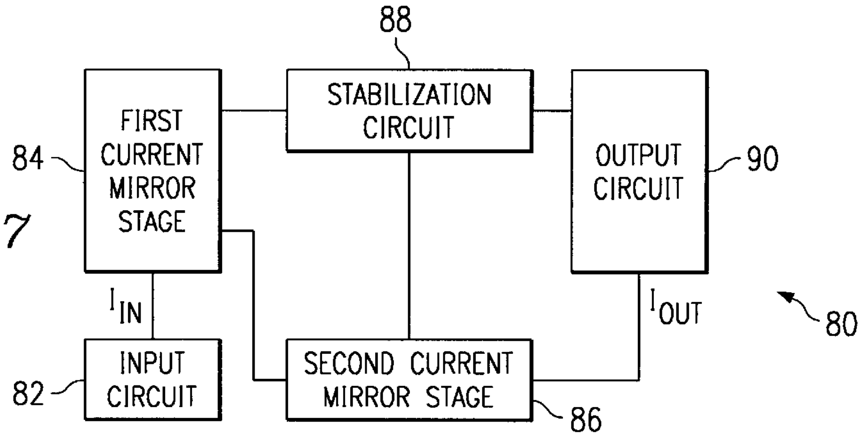
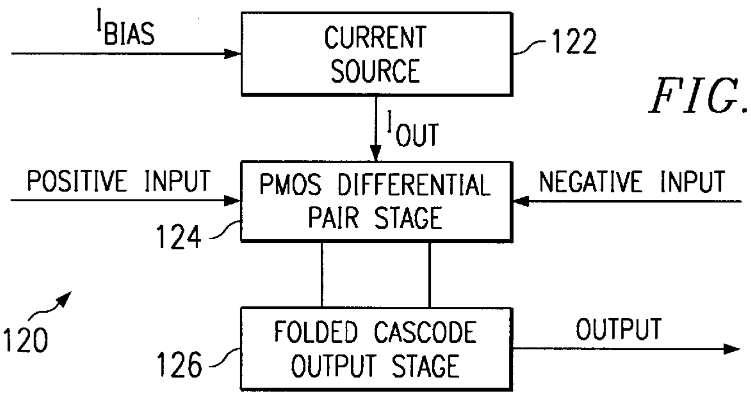
*FIG. 11*

HIGH IMPEDANCE MIRROR SCHEME WITH ENHANCED COMPLIANCE VOLTAGE

TECHNICAL FIELD OF THE INVENTION

This invention relates generally to regulated current sources and more particularly to a high-impedance current source having an enhanced compliance voltage.

BACKGROUND OF THE INVENTION

In today's analog low-voltage circuits it is desirable to provide enhanced current source functionalities such as the biasing of differential pairs with high impedance current sources. Current mirrors can be used to provide such enhanced functionalities. Current mirrors replicate at their outputs the currents present at their inputs and are widely used in the electronics industry. There are many variations of the basic current mirror that may provide such functionalities. Regular cascode, high-swing cascode, regulated cascode, low voltage current, and active-input regulated cascode mirrors are some of the known current source solutions utilized in the electronics industry to provide biasing of differential pairs. Mirroring functionality is quite useful in many circuit applications such as a regulated current source for transconductance amplifiers and high-speed digital receivers. A basic current mirror is illustrated in FIG. 1.

The basic current mirror 10 comprises two p-channel MOS transistors M11 and M12 having their gates 11 and 12 connected together and their sources 13 and 14 connected to a supply voltage $V_{DD}$. To optimize the operation of the current mirror 10, transistors M11 and M12 are biased to operate in the saturated region on or near the boundary between the linear and saturated regions, that is, the output characteristic is: $V_{DS}=V_{GS}-V_T$ where $V_{DS}$=drain to source voltage $V_{GS}$=gate to source voltage $V_T$=threshold voltage In this configuration, a source-drain current of a MOS transistor has a positive dependence upon not only the gate voltage but also the source-drain voltage in the saturated region. If the source-drain voltage increases and the gate voltage is maintained at a constant level, the source-drain current correspondingly increases. This phenomenon is called "Early effect". Early effect can be reduced by increasing the length of the PMOS transistors M11 and M12. The dependence of source drain voltage is responsible for the very low output resistance of this configuration. The current mirror circuit of FIG. 1 has been employed in current sources in the prior art.

FIG. 2 shows a regular cascode current mirror 20. With the regular cascode mirror 20, a current $I_{in}$ from the current source 27 flows through transistor M3, and a corresponding gate-source voltage appears between gate 27 and source 35 of the transistor M3. This gate-source voltage is determined in accordance with the characteristics of transistor M3 and by the current $I_{in}$ supplied from the constant current source 27. The current through transistor M2 mirrors the current through transistor M1. Likewise the current through transistor M4 mirrors the current through transistor M3. By adjusting the relative dimensions of transistors M1 and M2 and of transistors M3 and M4, a desired output current can be achieved.

This regular cascode current mirror 20 is a well-known scheme that enhances the output impedance of the circuit. However, it suffers from a lack of headroom, i.e., it begins to operate several 100 mv above the threshold voltage of a PMOS transistor, thus lowering the operating headroom left to other circuitry operations.

FIG. 3 illustrates a high-swing cascode current mirror 40. For the same output impedance as the regular cascode current mirror 20, the dynamics are improved. By a careful design of the cascode bias circuit, the need of at least one threshold voltage at the output is avoided. Nevertheless, both of the transistors in the output branch have to be in saturation mode.

Referring now to FIG. 4 there is shown a prior art regulated current mirror 50. This scheme uses feedback circuitry that controls the drain source voltage of the MOS transistor M2. Its output resistance is therefore multiplied by the feedback gain factor and will be one order of magnitude higher than a usual cascode scheme.

A low-voltage current mirror 60 is illustrated in FIG. 5. In this scheme if it is assumed that MOS transistors M1 and M2 have similar transconductance and output resistance, it can be shown that the output resistance is equal to the resistance of the current source driving transistor M1 ($R1_{In}$). Using this technique, the output resistance can be high and the compliance voltage is very low. However, an active part or operational transconductance amplifier (OTA) is required.

FIG. 6 illustrates an active-input regulated cascode current mirror 70. This mirror scheme requires two OTAs. Compliance voltage and output resistance are increased due to feedback. However, if performance, consumption and cost are considered, it does not appear as a good solution.

The above describe prior art solutions that have various disadvantages including lack of headroom, constrained operating characteristics, poor dynamics, and the need for controllable resistance devices (OTAs). What is needed then is a high-impedance current source which has a low compliance voltage, enhanced operating characteristics and dynamics, and which eliminates the need for OTAs.

SUMMARY OF THE INVENTION

These problems are generally solved, and technical advantages are generally achieved, by preferred embodiments of the present invention comprising a high impedance current source circuit having an enhanced compliance voltage. The current source circuit comprises an input circuit coupled to a first current mirror stage. A means for generating a biasing current produces a biasing current that is input into the input circuit. The first current mirror stage is in turn coupled to a second current mirror stage which acts as a feedback circuit. A stabilization circuit and output circuit which provides an output current are also included.

In one specific embodiment of the present invention, the first current mirror stage comprises a first transistor coupled to a second transistor; the second current mirror stage comprises a third transistor coupled to a fourth transistor; the stabilization circuit comprises a fifth transistor coupled to a sixth transistor, wherein the stabilization circuit is coupled between the first and second current mirror stages; and the output circuit comprises a seventh transistor connected to the stabilization circuit between the first and second current mirror stages.

The present invention also discloses a method for mirroring a current in the above embodiment of the present invention. The method comprises generating the biasing current; converting the biasing current into a gate voltage on the first, second, fifth, and sixth transistors; fixing the voltage across the fourth transistor whereby the percentage of current flowing through the sixth transistor and the fourth transistor is equal to the current flowing from the second transistor; and delivering a fixed current to the sixth and seventh transistors, whereby the voltage of said fifth transistor is substantially controlled to produce a stable output current.

An advantage of the preferred embodiment of the present invention is that the circuit has a low compliance voltage or point at which the circuit will operate. The low compliance voltage is due to the feedback operation included in the present invention. This low compliance voltage allows headroom for other circuitry operations.

Another advantage of the preferred embodiment of the present invention is that it is suitable for biasing wide common mode range differential pairs.

A further advantage of the preferred embodiment of the present invention is that the need for an active part or OTA is eliminated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTIONS OF THE DRAWINGS

The above features of the present invention will be more clearly understood from consideration of the following descriptions in connection with accompanying drawings in which:

FIG. 1 illustrates a basic current mirror;

FIG. 2 illustrates a prior art current mirror in the form of a regular cascode current mirror;

FIG. 3 illustrates a prior art regulated cascode mirror scheme;

FIG. 4 illustrates a prior art high swing cascode current mirror scheme;

FIG. 5 illustrates a prior art low voltage current mirror scheme;

FIG. 6 illustrates a prior art active-input regulated cascode current mirror scheme;

FIG. 7 is a block diagram of the present invention;

FIG. 11 is a simple block diagram of a high-speed digital receiver utilizing an embodiment of the present invention.

DETAILED DESCRIPTION OF THE INVENTION

Figure 8:
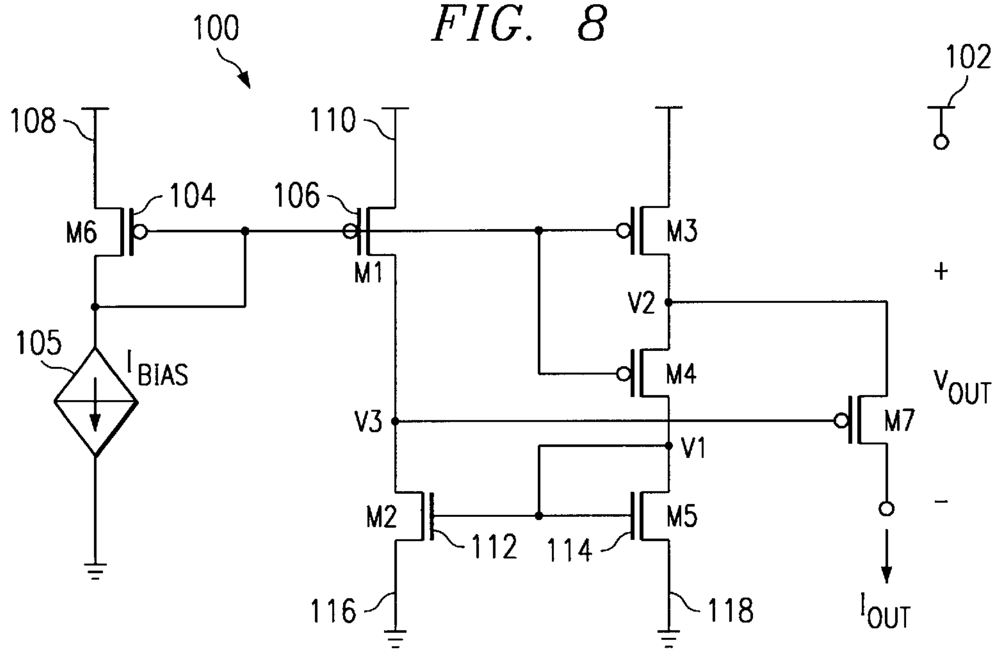
FIG. 8 illustrates one embodiment of the present invention.

Referring to the figures, FIG. 7 is a block diagram of the present invention, wherein a current source 80 comprises an input circuit 82, a first current mirror stage 84, a second current mirror stage 86, a stabilization circuit 88, and an output circuit 90. The input circuit 82 provides a biasing current for the current mirror 80. The biasing current for the current mirror 80 may be applied in several ways which include, but are not limited to, utilizing external circuitry which resides on a medium (e.g. fabricated chip) different from that of the current mirror 80 to supply the biasing current, utilizing a current generator resident on the same medium, or using a resistor with a supplied voltage.

The first current mirror stage 84 converts the biasing current to a gate voltage for the stabilization circuit 88 which delivers a fixed current to the output circuit 90. The stabilization circuit 88 offsets variations in the output voltage that in turn cause variations in the regulated output current. The second current mirror stage 86 is interfaced with the first current mirror stage 84 and the stabilization circuit 88 to function as a feedback circuit. The output circuit 90 provides the regulated output current.

In FIG. 8 there is shown a preferred embodiment of the present invention wherein seven transistors are used to provide the high-impedance, low-compliance characteristics of the innovative current source 100. MOS transistors, M6 and M1 form the first current mirror stage. Transistors M6 and M1 include gates, 104 and 106 respectively, which are tied together, and sources, 108 and 110 respectively, which are connected to a voltage source 102. Gates 104 and 106 are tied to the drain of transistor M6 and to bias current source 105. Current source 105 provides the gate voltage for gate 106 of transistor M1. The stabilization circuit comprises MOS transistors M3 and M4. When the gate voltage at M1 is generated, the transistor M1 generates a biasing current for the second current mirror stage, which comprises MOS transistors M2 and M5. Transistors M2 and M5 include gates, 112 and 114 respectively, which are tied together and drains 116 and 118, respectively, which are connected to a ground 120. The output circuit comprises a MOS transistor M7.

In operation, the transistor M3 will deliver a fixed current if its drain voltage is fixed to a stable value. In this circuit, this drain voltage is determined by transistor M4 in subthreshold mode. By a careful design, the saturation of transistor M3 can still be guaranteed even if both transistors M3 and M4 are tied to the same gate. This can be achieved by a high W/L ratio of transistor M4 and setting a very low drain current on transistor M4. If the drain voltage of transistor M3 decreases (as a result of an increase in the output voltage $V_{out}$), the current through transistor M4 will diminish. This results in less current through the second current mirror stage comprised of transistors M2 and M5. The decreased current through transistor M2 causes the voltage at node V3 to increase and hence to increase at the gate of output transistor M7 as well. This increase in gate voltage decreases the current flow through transistor M7, thus offsetting the effects of the increased output voltage. Therefore, any change on the drain of transistor M3 due to the variation of the output voltage will be offset by operation of the second current mirror stage. Likewise, a decrease in the output voltage will be fed back through the second current mirror stage via transistor M4 and will result in a decreased gate voltage on transistor M7. The decreased voltage on transistor M7 allows for increased current flow through transistor M7.

Quantitatively, the current is mainly determined by the mirror ratio between MOS transistors M1, M6, and M3. As explained above, the very high stability in the output current $I_{out}$ is obtained by tightly controlling the drain voltage of transistor M3, i.e. $V_2$. Deriving a small part of the drain current of transistor M3 in a 1:1 NMOS second current mirror stage, comprised of transistors M5 and M2, provides the tight control of $V_2$.

When the circuit is in balance, the percentage of transistor M3 drain current flowing though transistors M4 and M5 is equal to the drain current of transistor M1. To get transistor M3 in saturation mode, this percentage and the size of M4 has to be chosen in such a way transistor M4 operates in the weak inversion region or in sub threshold mode. This means the current ratio between transistors M3 and M1 has to be very high to avoid excessively large dimensions for transistor M4.

$$I_{out} = I_3 - I_1 = \frac{n_p\beta_T}{2}(V_{p3} - V_{DD} + V_2)^2 \quad (5)$$

$$\text{where } V_{p3} \cong \frac{|V_{G7}| - |V_{T_p}|}{n_p} = \frac{V_{DD} - V_3 - |V_{T_p}|}{n_p} \quad (6)$$

Should the node V2 vary in one direction due to early effect in transistors M7 or M3, then the small current of transistor M4 should change in the same direction, leading to an opposite variation on the gate of transistor M7. This would stabilize the change. The high output impendence can be demonstrated with an equivalent small-signal circuit as shown in FIG. 9.

Figure 9:
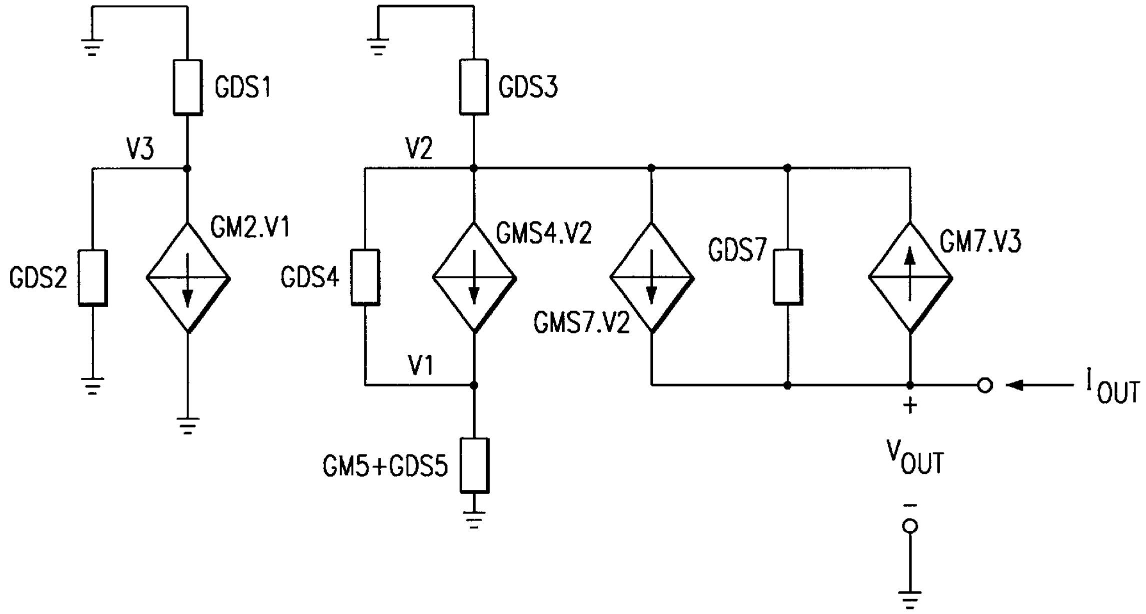
FIG. 9 shows the equivalent small-signal circuit of the one embodiment of the present invention.

Referring to FIG. 9, if the current sums are written for all the nodes, the following equations can be derived:

$$\begin{pmatrix} g_{m2} & 0 & g_{ds1} + g_{ds2} \\ -g_{ds4} & g_{ms4} + g_{ms7} + g_{ds3} + g_{ds4} + g_{ds7} & -g_{m7} \\ g_{m5} + g_{ds5} + g_{ds4} & -g_{ms4} - g_{ds4} & 0 \end{pmatrix} \begin{pmatrix} v_1 \\ v_2 \\ v_3 \end{pmatrix} = \begin{pmatrix} 0 \\ g_{ds7} v_{out} \\ 0 \end{pmatrix} \quad (7)$$

This scheme will fix the voltage V2 at the beginning of the saturation mode for transistor M3 and it will ensure a current proportional to the aspect ratios in transistors M6, M1, and M3.

The drain current of M1 can be written as:

$$I_1 = \frac{n_p\beta_1}{2} Vp1 2 = \frac{n_p\beta_1 C_{ax}\left(\frac{W_1}{L_1}\right)}{2} V_1^2 \quad (1)$$

where $$V_{p1} \cong \frac{|V_{G1}| - |V_{T_p}|}{n_p}$$

is the pinch-off voltage or the voltage for which transistor M1 leaves its saturation region.

$V_{T_p}$ is the threshold voltage for PMOS and $n_p$ is the slope factor of the gate voltage versus the pinch-off. Similarly the drain current of transistor M3 in saturation is:

$$I_3 = \frac{n_p\beta_3}{2} Vp1 2 \quad (2)$$

This is valid as long as:

$$|V_{DS3}| = V_{DD} - V_2 \geqq V_{p1} \quad (3)$$

If we assume transistor M4 is in the weak inversion region, then its drain current will have an exponential characteristic:

$$I_4 = 2n_p\beta_4 U_T^2 \exp\left(\frac{V_{p1} - V_{DD} + V_2}{U_T}\right) \quad (4)$$

where $U_T$ is the thermal voltage kT/q. It can be seen that if $I_4((2n_p\beta_4 U_T^2$, the argument of the exponential will be negative and the condition (3) can be met. This also means that the shape factor (W/L) of transistor M4 has to be very large and/or its drain current $I_4$ has to be very small. Due to the high gain from the source of transistor M4 to the gate of transistor M7, this node is kept at a level such that:

In addition, the output current can be expressed as:

$$i_{out} = (0 - (g_{ms7} + g_{ds7})g_{m7}) \begin{pmatrix} v_1 \\ v_2 \\ v_3 \end{pmatrix} + g_{ds7} v_{out} \quad (8)$$

where $g_{ms4} = g_{m4} + g_{mb4}$

If some simplifications are done, i.e. if output conductance is neglected versus transconductance, an approximate formula can be derived for the tail current source output resistance:

$$R_{out} = \frac{v_{out}}{i_{out}} \cong \left(\frac{1}{g_{ds7}}\right)\left(\frac{g_{m2} g_{ms4} g_{m7}}{(g_{ds1} + g_{ds2})(g_{ms4} + g_{ds3})g_{m5}}\right) \quad (9)$$

The output resistance of transistor M7 is in fact multiplied by two dominant gain terms:

$$\left(\frac{g_{m2}}{g_{ds1} + g_{ds2}}\right),$$

which can be one or several decades, and $$\left(\frac{g_{m7}}{g_{m5}}\right),$$

which is also important due to the significant ratio between the current flowing in transistor M7 and the one that is mirrored in transistors M5 and M2. This leads to an output resistance that can be as high as several megaohms.

Another parameter has to be considered: the compliance voltage (or the minimum output voltage Vout for which the circuit still performs properly):

$$(V_{out})_{min} = |V_{DS_{sat3}}| + |V_{DS_{sat7}}| \quad (10)$$

The presence of any threshold voltage in the above equation does not penalize this scheme. This voltage can be as low as 400–600 mV in all voltage, temperature, and process conditions.

Figure 10:
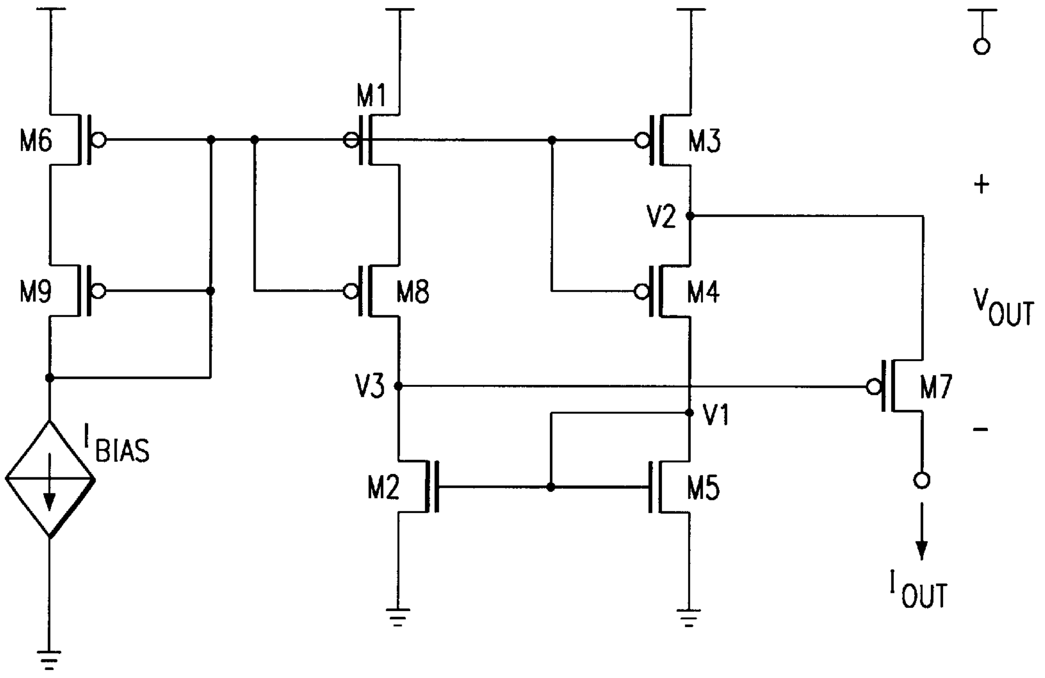
FIG. 10 illustrates another embodiment of the present invention.

FIG. 10 illustrates another embodiment of the present invention. In this current mirror scheme, the W/L ratio of transistors M6, M3 and M1 better control the ratio between the biasing current and output current. The addition of transistors M8 and M9 allows transistors M6 and M1 to be set in the same voltage conditions as transistor M3. This is true, however, if the size ratio between transistors M6 and M9, M1 and M8 and M3 and M4 are all identical.

FIG. 11 is a simple block diagram of a high-speed digital receiver 120 utilizing an embodiment of the present invention. A biasing current $I_{BIAS}$ is input to the current source circuit 122 of the present invention. The current source circuit 122 provides a regulated current $I_o$ to a differential pair stage 124 utilizing PMOS transistors. The differential pair stage 124 is provided a positive input and a negative input which results in an output to a folded cascode output stage 126. The operation of the folded cascode output stage 126 results in an output current $I_{out}$.

Figure 12:
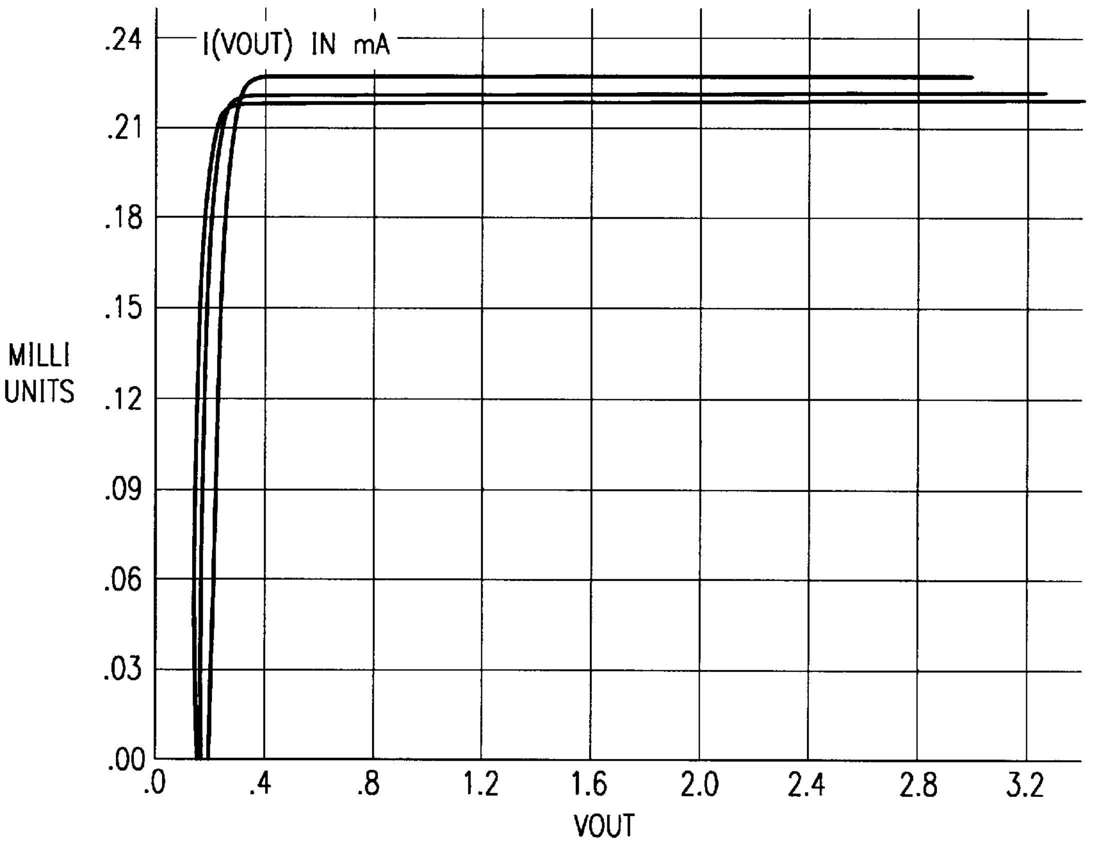
FIG. 12 shows the DC current versus the output voltage of the present invention.

In FIG. 12 is shown the DC current versus the output voltage of the above described preferred embodiments. The results were obtained using 0.18 μm effective length CMOS technology with 3.3V transistors. The curve is very horizontal and the output impedance is around 10 Mohm for an output current of 230 μA. The second current mirror stage comprising transistors M2 and M5 has a ratio of 2:1. The transistors M6, M1, and M3 have a 1:1:21 ratio. About half of the current flowing into transistor M1 flows into transistor M4. For this technology, the product ILIM sq=$2n_p\beta_pU_T^2$ for a square PMOS transistor is equal to 100 nA. This means that the saturation condition (3) will be met with a very large transistor. Assuming an input current of 12 μA is applied to transistor M6, a reasonable size for transistor M4 is 400 um/0.9 um. The drain current of transistor M4 (6 μA) will be around 13% of 100 nA×400/0.9 and the sub threshold mode can therefore be guaranteed. The spread versus temperature, process and supply voltage is rather small as shown by the proximity of the curves. Moreover, the flat part of the curves begins as low as 400 mV.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current source circuit comprising:

an input circuit for supplying a biasing current;

a first current mirror stage coupled to the input circuit for receiving the biasing current and for converting the biasing current into a voltage;

a stabilization circuit receiving the voltage and providing a first current as an output;

an output circuit including a MOS device having a gate and passing the first current through a source-drain path of the MOS device for providing a stable output current at an output port of the current source circuit; and a second current mirror stage coupled to the first current mirror stage, to the stabilization circuit and to the output circuit, for sensing a variation in the stable output current and for changing a voltage applied to the gate of the MOS device so as to counteract the variation in the stable output current.

2. The current source circuit of claim 1 wherein the first current mirror stage comprises:

a first transistor having a first gate node, a first source node, and a first drain node, the first gate node connected to the first drain node, the first drain node connected to the input circuit and the first source node connected to a voltage source; and a second transistor having a second gate node, a second source node, and a second drain node, the second gate node connected to the first gate node of the first transistor, the second drain node connected to the second current mirror circuit and the second source node connected to the voltage source;

whereby the current through the first transistor is mirrored by the second transistor.

3. The current source circuit of claim 2 wherein the second current mirror stage comprises:

a third transistor having a third gate node, a third source node, and a third drain node, the third source node connected to the second drain node of the second transistor and the third drain node connected to a ground; and a fourth transistor having a fourth gate node, a fourth source node, and a fourth drain node, the fourth gate node and the fourth source node tied together, the fourth gate node connected to the third gate node of the third transistor, the fourth drain node connected to the ground and the fourth source node connected to the stabilization circuit.

4. The current source circuit of claim 3 wherein the stabilization circuit comprises:

a fifth transistor having a fifth gate node, a fifth source node, and a fifth drain node, the fifth source node connected to the voltage source and the gate node connected to the first gate node of the first transistor; and a sixth transistor having a sixth gate node, a sixth source node, and a sixth drain node, the sixth gate node connected to the fifth gate node of the fifth transistor, the sixth drain node connected to the fourth source node of the fourth transistor and the sixth source node connected to the fifth drain node of the fifth transistor.

5. The current source circuit of claim 4 wherein the output circuit comprises a seventh transistor having a seventh gate node coupled to the third source node of the third transistor, a seventh source node connected to the fifth drain node of the fifth transistor, and a seventh drain node providing the stable output current.

6. The current source circuit of claim 1 wherein the first current mirror stage is a cascode circuit current mirror circuit.

7. The current source circuit of claim 1 wherein the first current mirror stage is a regulated cascode current mirror circuit.

8. The current source circuit of claim 1 wherein the second current mirror stage is a cascode current mirror circuit.

9. The current source circuit of claim 1 wherein the second current mirror stage is a regulated cascode current mirror circuit.

10. The current source circuit of claim 1 wherein the current mirror circuit is implemented as an integrated circuit.

11. A current source circuit comprising:

a means for generating a biasing current;

a first current mirror stage having a first transistor coupled to a second transistor, and for converting the biasing current into a voltage;

a stabilization circuit having a third transistor coupled to a fourth transistor, the stabilization circuit coupled to the first current mirror stage for receiving the voltage and providing a first current as an output;

an output circuit having a fifth transistor having a gate and passing the first current through a source-drain path of the fifth transistor to provide an output current; and a second current mirror stage having a sixth transistor coupled to a seventh transistor, the second current mirror coupled to the first current mirror stage, to the stabilization circuit and to the output circuit, acting as a feedback circuit by sensing a variation in the output current and for changing a voltage applied to the gate of the fifth transistor so as to counteract the variation in the output current.

12. The current source circuit of claim 11 wherein the first, second, third, fourth, fifth, sixth, and seventh transistors each comprise a source node, a drain node, and a gate node.

13. The current source circuit of claim 12 wherein the means for generating a biasing current is coupled to the first transistor through the drain node of the first transistor.

14. The current source circuit of claim 13 wherein the gate of the first transistor is connected to the drain of the first transistor for converting the biasing current into a voltage on the gate of the second, fifth, and sixth transistors.

15. The current source circuit of claim 14 wherein the source node of the first, second, and fifth transistors are connected to a voltage source.

16. The current source circuit of claim 15 wherein the gate node of the seventh transistor is coupled to the drain node of the second transistor.

17. The current source circuit of claim 16 wherein the gate of the fourth transistor is connected to the source of the fourth transistor and to the gate of the third transistor whereby the current flowing from the sixth transistor is mirrored at the third transistor.

18. The current source of claim 17 further comprising an eighth transistor having a source, gate, and drain nodes, the eighth transistor coupled between the second drain node of the second transistor and the third source node of the third transistors by way of its source and drain nodes, the eight gate node connected to the second gate node of the second transistor.

19. The current source of claim 18 further comprising a ninth transistor having a source, gate, and drain nodes, the ninth transistor coupled between the means for generating a biasing current and the first drain node of the first transistor by way of its source and drain nodes, the ninth gate connected to the ninth drain node and to the first gate node of the first transistor.

20. A regulated current source circuit comprising:

a means for generating a biasing current;

a first transistor having a first source, first gate, and first drain nodes, the first gate node and the first drain node tied together, the first source node coupled to a voltage source, the first drain node coupled to the means for generating a biasing current;

a second transistor having a second source, second gate, and second drain nodes, the second gate node coupled to the first drain node of the first transistor, the second source node coupled to the voltage source;

a third transistor having a third source, third gate, and third drain nodes, the third source node coupled to the second drain node of the second transistor, the third drain node coupled to a ground;

a fourth transistor having a fourth source, fourth gate, and fourth drain nodes, the fourth gate node and the fourth source node tied together, the fourth gate node coupled to the third gate node of the third transistor, the fourth drain node coupled to the ground, the third and fourth transistors acting as a feedback circuit;

a fifth transistor having a fifth source, fifth gate, and fifth drain nodes, the fifth gate node coupled to the first gate node of the first transistor, the fifth source node coupled to the voltage source;

a sixth transistor having a sixth source, sixth gate, and sixth drain nodes, the sixth gate node coupled to the fifth gate node of the fifth transistor, the sixth source node coupled to the fifth drain node of the fifth transistor, the sixth drain node coupled to the fourth source node of the fourth transistor; and a seventh transistor having a seventh source, seventh gate, and seventh drain nodes, the seventh gate node coupled to the third source node, the seventh source node coupled to the fifth drain node of the fifth transistor, the output circuit providing an output current.

21. A high speed differential receiver comprising:

a means for generating a biasing current;

a current mirror circuit, comprising an input circuit for supplying a biasing current, a first current mirror stage coupled to the input circuit for receiving the biasing current and for converting the biasing current into a voltage, a stabilization circuit receiving the voltage and providing a first current as an output, an output circuit including a MOS device having a gate and passing the first current through a source-drain path of the MOS device for providing a stable output current at an output port of the current source circuit, and a second current mirror stage coupled to the first current mirror stage, to the stabilization circuit and to the output circuit, for sensing a variation in the stable output current and for changing a voltage applied to the gate of the MOS device so as to counteract the variation in the stable output current;

a differential pair stage coupled to the current mirror circuit; and a folded cascode output stage coupled to the differential pair stage;

whereby an output current is produced.

22. A method for mirroring a current in a current mirror circuit having a means for generating a biasing current, the means coupled to a first current mirror stage having a first transistor and a second transistor, a second current mirror stage having a third transistor coupled to a fourth transistor, the second current mirror acting as a feedback circuit, a stabilization circuit having a fifth transistor coupled to a sixth transistor, the stabilization circuit coupled between the first and second current mirror stages, and an output circuit having a seventh transistor connected to the stabilization circuit and to a connection node of the first and second current mirror stages, the method comprising the steps of:

generating the biasing current and providing the biasing current to the first current mirror stage;

converting the biasing current into a gate voltage on the first, second, fifth, and sixth transistors;

fixing the voltage across the fifth transistor whereby the percentage of current flowing through the sixth transistor and the fourth transistor is equal to the current flowing from the second transistor; and delivering a fixed current to the sixth and seventh transistors;

whereby the voltage across the fifth transistor is substantially controlled to produce a stable output current.

* * * * *